United States Patent [19]
Mori et al.

[11] Patent Number: 5,304,829
[45] Date of Patent: Apr. 19, 1994

[54] NONVOLATILE SEMICONDUCTOR DEVICE

[75] Inventors: Seiichi Mori; Kuniyoshi Yoshikawa, both of Tokyo, Japan

[73] Assignee: Kabushiki Kaisha Toshiba, Kawasaki, Japan

[21] Appl. No.: 730,704

[22] Filed: Jul. 16, 1991

Related U.S. Application Data

[63] Continuation-in-part of Ser. No. 463,547, Jan. 11, 1990, abandoned.

[30] Foreign Application Priority Data

Jan. 17, 1989 [JP] Japan .................................. 1-8006

[51] Int. Cl.⁵ .................... H01L 29/68; H01L 21/265
[52] U.S. Cl. .................... 257/324; 257/316; 257/637; 257/640; 257/760; 437/42; 437/43; 437/195; 437/913; 437/920; 437/978
[58] Field of Search .............. 357/23.5, 54; 257/316, 257/324, 637, 640, 760; 437/42, 43, 195, 913, 920, 978

[56] References Cited

U.S. PATENT DOCUMENTS

| | | | |
|---|---|---|---|
| 4,360,900 | 11/1982 | Bate . | |
| 4,768,080 | 8/1988 | Sato et al. . | |
| 4,870,470 | 9/1989 | Bass et al. | 357/23.5 |
| 5,053,840 | 10/1991 | Yoshikawa | 357/23.5 |

FOREIGN PATENT DOCUMENTS 0187278 12/1985 European Pat. Off. .

OTHER PUBLICATIONS

1984 Symposium on VLSI Technology, Digest of Technical Papers, Sep. 10-12, 1984.
Extended Abstracts (The 38th Spring Meeting 1991); The Japan Society of Applied Physics and Related Societies.
29th Annual Proceedings, "Threshold Voltage Instability and Charge Retention in Nonvolatile Memory Cell with Nitride/Oxide Double-Layered Inter-poly Dielectric". Apr. 9, 10, 11, 1991.

*Primary Examiner*—Edward Wojciechowicz
*Attorney, Agent, or Firm*—Banner, Birch, McKie & Beckett

[57] ABSTRACT

In a nonvolatile semiconductor memory device with a two-layer gate structure, an interlayer insulating film is formed on a floating gate electrode of, e.g., polycrystalline silicon. The interlayer insulating film has a four-layer structure in which a first silicon nitride film, a first silicon oxide film, a second silicon nitride film and a second silicon oxide film are laminated in this order on the floating gate electrode, or a two-layer structure in which a first silicon nitride film and a first silicon oxide film are laminated in this order on the floating gate electrode. With the above structure, the threshold voltage of the semiconductor device is stabilized even after data-erase operation. Since, moreover, the first silicon oxide film can be formed by oxidizing the first silicon nitride film, then the quality of the first silicon oxide film can be enhanced, and accordingly the charge retaining properties of the device can be increased.

25 Claims, 8 Drawing Sheets

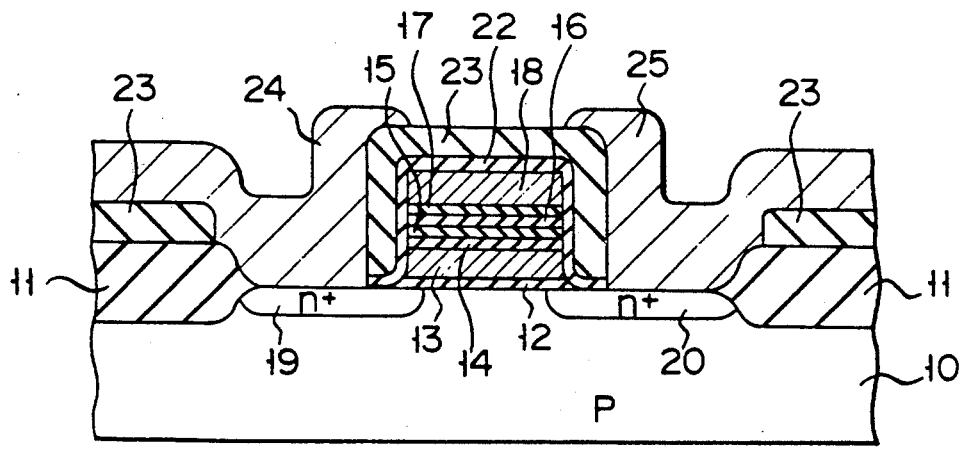
F I G. 1
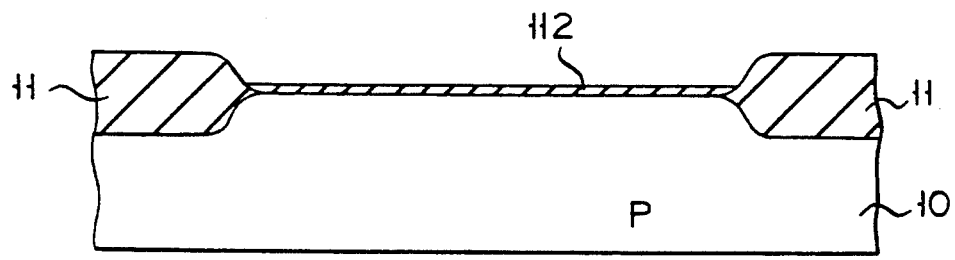
F I G. 2A
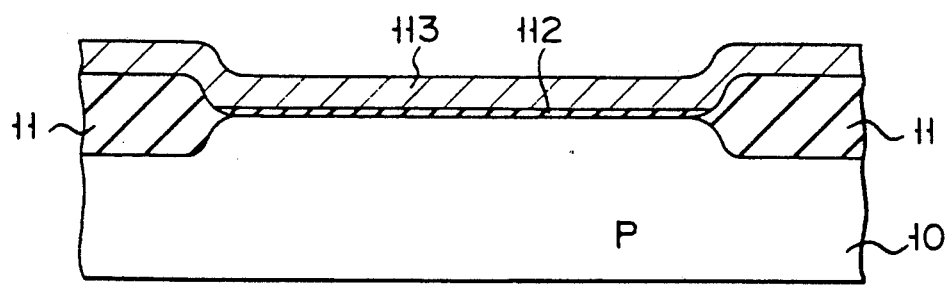
F I G. 2B

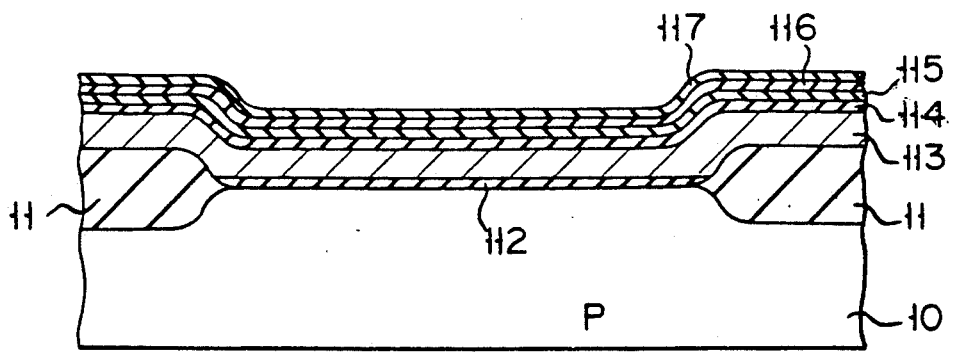
F I G. 2C
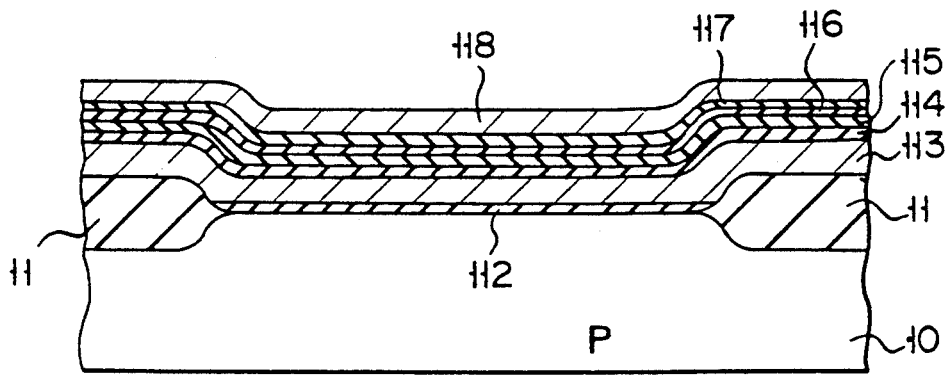
F I G. 2D
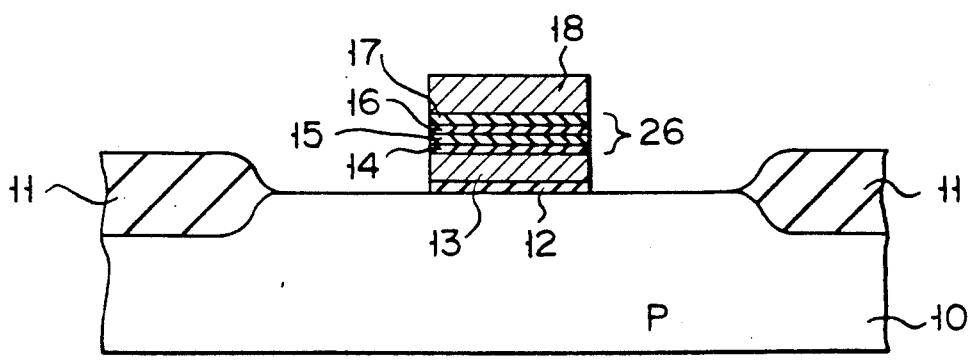
F I G. 2E

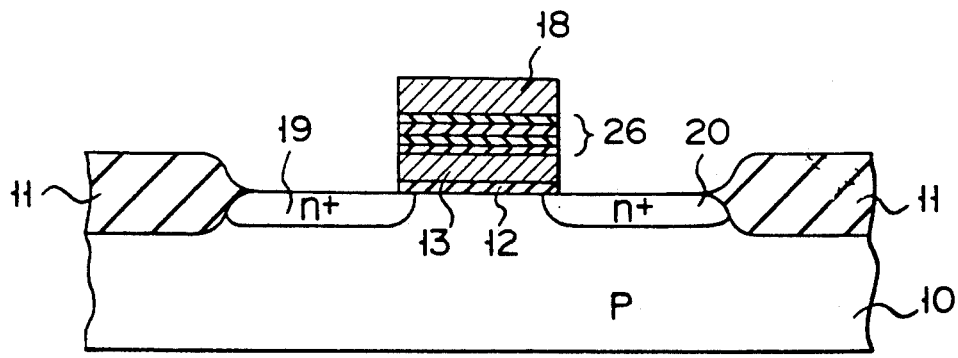
F I G. 2F
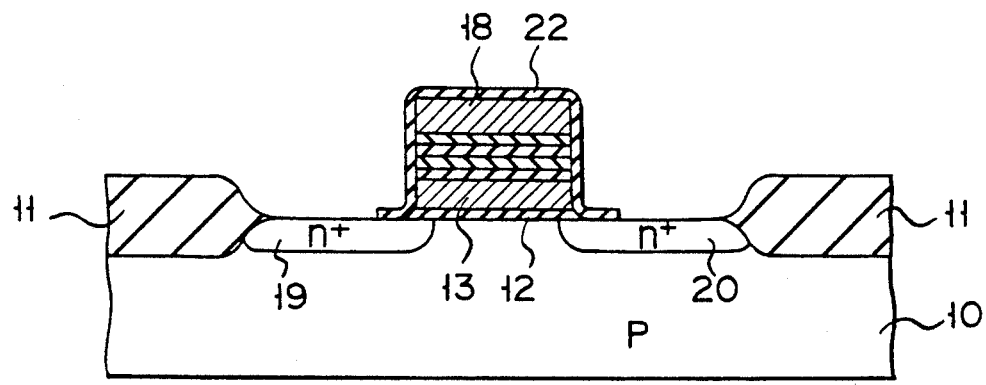
F I G. 2G
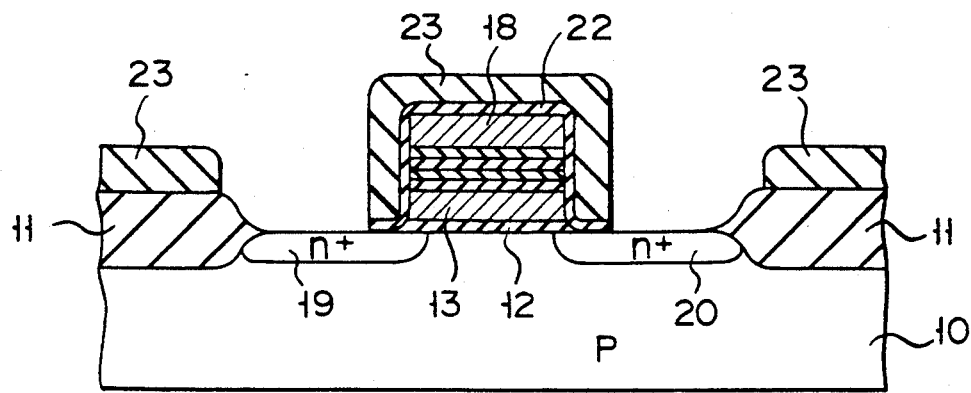
F I G. 2H

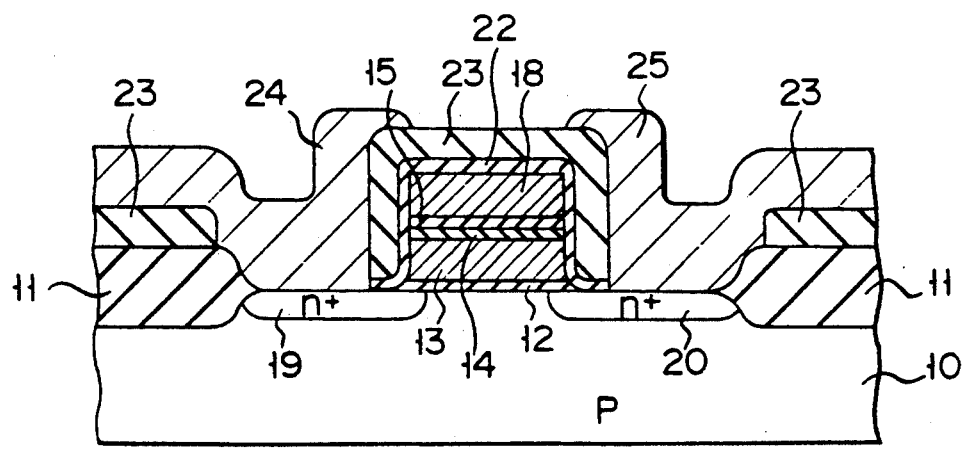
F I G. 4
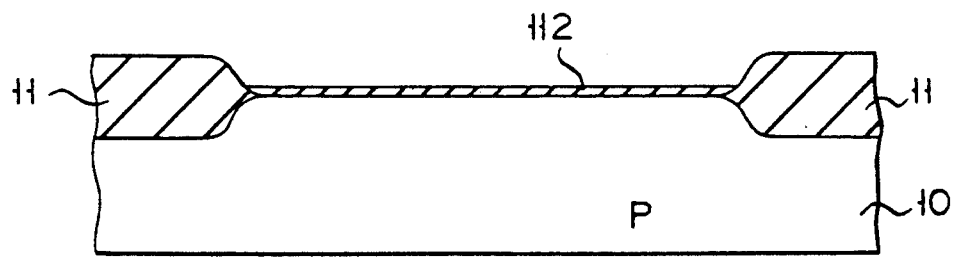
F I G. 5A
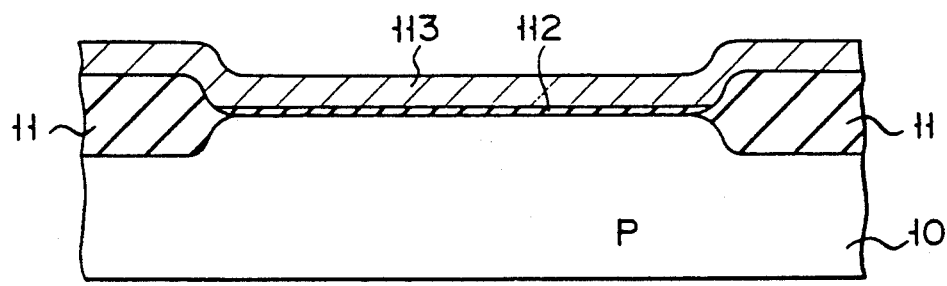
F I G. 5B

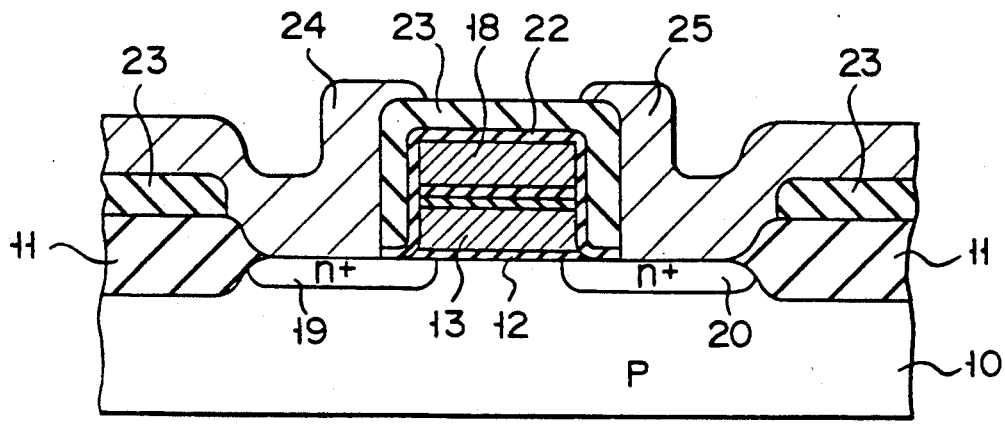
F I G. 5I
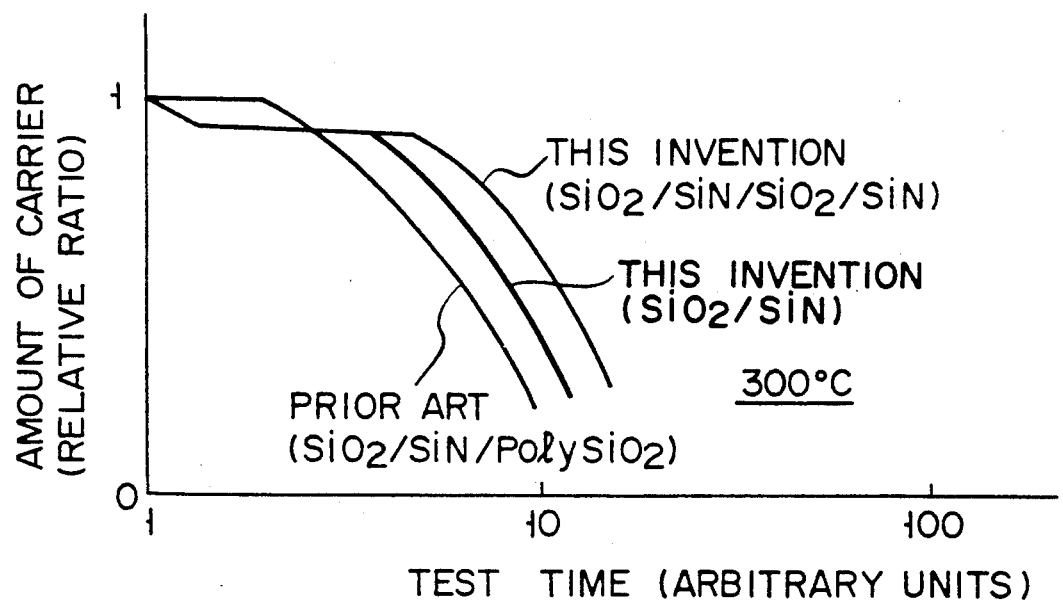
F I G. 6

NONVOLATILE SEMICONDUCTOR DEVICE

CROSS-REFERENCE TO RELATED APPLICATION

This application is a continuation-in-part of U.S. application Ser. No. 463,547 filed on Jan. 11, 1990, now abandoned.

BACKGROUND OF THE INVENTION

1. Field of the Invention

The present invention relates to a nonvolatile semiconductor memory device with a two-layer gate structure.

2. Description of the Related Art

In a conventional nonvolatile memory device with a two-layer gate structure, a single-layer thermal oxide film is used as an interlayer insulating film interposed between a floating gate electrode and a control gate electrode. On the other hand, in accordance with miniaturization of semiconductor elements, the thickness of the interlayer insulating film has been reduced. Where the interlayer insulating film is thin, a high electric field is applied to the interlayer insulating film while the memory device is charged. Consequently, there is a concern that the insulating film may be destroyed.

Under the circumstances, the use of an interlayer insulating film with a three-layer structure of an oxide film (first oxide film), a nitride film and an oxide film (hereinafter, referred to as ONO structure) has been proposed in order to increase a breakdown voltage of the interlayer insulating film. However, since the first oxide film formed directly on a floating electrode is a polycrystalline silicon thermal oxide film in which impurities are diffused at high concentration, the composition of the first oxide film is not uniform, and the quality of the film is not good. Thus, if the semiconductor device is reduced in size and the interlayer insulating film is made thinner, the charge retaining property of the device is degraded.

As stated above, in the prior art, even if the interlayer insulating film between the floating gate electrode and the control electrode has the three-layer structure, the charge retaining property of the device is degraded if the thickness of the insulating film is reduced due to the miniaturization of the semiconductor

SUMMARY OF THE INVENTION

An object of the present invention is to provide a nonvolatile memory device wherein excellent data retaining properties can be maintained even if the thickness of an interlayer insulating film between a floating gate electrode and a control gate electrode is reduced.

In order to achieve the above object, in a non-volatile semiconductor memory device of the present invention, an interlayer insulating film formed on a floating gate electrode of, e.g., polycrystalline silicon, has a four-layer structure (hereinafter, called NONO structure) in which a first silicon nitride film, a first silicon oxide film, a second silicon nitride film and a second silicon oxide film are laminated in this order on the floating gate electrode.

According to the present invention, there is provided a nonvolatile memory device with a two-layer gate structure, comprising:
 a first gate electrode;
 a second gate electrode; and
 an interlayer insulating film provided between the first and second gate electrodes, an interlayer insulating film having a four-layer structure wherein a first silicon nitride film, a first silicon oxide film, a second silicon nitride film and a second silicon oxide film are laminated in this order on the first gate electrode.

According to the present invention, there is further provided a four-layer insulating gate structure for use in a nonvolatile semiconductor cell having a first and second gate structure, comprising:
 a first silicon nitride film formed on the first gate structure;
 a first silicon oxide film formed on the first silicon nitride film;
 a second silicon nitride film formed on the first silicon oxide film; and
 a second silicon oxide film formed on the second silicon nitride film.

According to the present invention, there is still further provided a nonvolatile semiconductor memory device including a plurality of memory cells, each memory cell having a two-layer gate structure, comprising:
 a first gate electrode;
 a second gate electrode; and
 an insulating multi-layer structure between the first gate electrode and the second gate electrode, the insulating film structure including:
 a first silicon nitride layer formed on the first gate electrode;
 a first silicon oxide layer formed on the first silicon nitride layer;
 a second silicon nitride layer formed on the first silicon oxide layer; and
 a second silicon oxide layer formed on the second silicon nitride layer.

According to the present invention, there is yet further provided a nonvolatile semiconductor memory cell having a two-layer gate structure, comprising:
 a first gate electrode;
 a second gate electrode; and
 an insulating multi-layer structure between the first gate electrode and the second gate electrode, the insulating film structure including:
 a first silicon nitride layer formed on the first gate electrode;
 a first silicon oxide layer formed on the first silicon nitride layer;
 a second silicon nitride layer formed on the first silicon oxide layer; and
 a second silicon oxide layer formed on the second silicon nitride layer.

According to the present invention, there is further provided a method of forming an interlayer insulating film between a first gate electrode and a second gate electrode in a nonvolatile memory device comprising the steps of;
 forming a first layer of silicon nitride film on the first gate electrode;
 forming a first layer of silicon oxide film on the first layer of silicon oxide film;
 forming a second layer of silicon nitride film on the first silicon oxide film; and
 forming a second layer of silicon oxide film on the second layer of silicon nitride film.

If the thickness of the first silicon nitride film is set to be 60Å or less, electrons in the first silicon nitride film are prevented from diffusing into the first gate electrode after a data-erase operation. If the thickness of the first silicon nitride film is set over 60Å, electrons in the first silicon nitride film will diffuse into the first gate electrode after a data-erase operation, with the result that the threshold voltage of the semiconductor device is increased. Thus, it is preferable for stabilization of the threshold voltage of the semiconductor device to set the thickness of the first silicon nitride film to be 60Å or less.

If the thickness of the first silicon oxide film is set to be 50Å or more, the first silicon oxide film can have a sufficient energy gap, and tunneling of carriers through the first silicon oxide film can be prevented.

If the thickness of the second silicon nitride film is set to be 70Å or more, leakage of electrons from the first gate electrode can be prevented. Also, if the thickness of the second silicon nitride film is set to be 150Å or less, movement of the carriers in the second nitride film which may lead to the threshold voltage instability can be prevented.

It is desirable that the second silicon oxide film have a thickness of 20Å or more, in order to prevent the injection of holes from the control gate electrode into the second silicon oxide film.

With the above four-layer insulating film structure, the breakdown voltage of the semiconductor device can be increased, when a high electric field strength is applied to the insulating film structure. Since, furthermore, the first silicon oxide film can be formed by oxidizing the first silicon nitride film, the quality of the first silicon oxide film can be enhanced, and accordingly the charge retaining properties of the semiconductor device can be increased.

In order to achieve the above object, in a further non-volatile semiconductor memory device of the present invention, an interlayer insulating film formed on a floating gate electrode of, e.g., polycrystalline silicon, has a two-layer structure (hereinafter, called NO structure) in which a first silicon nitride film and a first silicon oxide film are laminated in this order on the floating gate electrode.

According to the present invention, there is provided a nonvolatile memory device with a two-layer gate structure, comprising:
a first gate electrode;
a second gate electrode; and
an interlayer insulating film provided between the first and second gate electrodes, an interlayer insulating film having a two-layer structure wherein a first silicon nitride film and a first silicon oxide film are laminated in this order on the first gate electrode.

According to the present invention, there is further provided a two-layer insulating gate structure for use in a nonvolatile semiconductor cell having a first and second gate structure, comprising:
a first silicon nitride film formed on the first gate structure; and
a first silicon oxide film formed on the first silicon nitride film.

According to the present invention, there is still further provided a nonvolatile semiconductor memory device including a plurality of memory cells, each memory cell having a two-layer gate structure, comprising:
a first gate electrode;
a second gate electrode; and
an insulating multi-layer structure between the first gate electrode and the second gate electrode, the insulating film structure including:
a first silicon nitride layer formed on the first gate electrode; and
a first silicon oxide layer formed on the first silicon nitride layer.

According to the present invention, there is yet further provided a nonvolatile semiconductor memory cell having a two-layer gate structure, comprising:
a first gate electrode;
a second gate electrode; and
an insulating multi-layer structure between the first gate electrode and the second gate electrode, the insulating film structure including:
a first silicon nitride layer formed on the first gate electrode; and
a first silicon oxide layer formed on the first silicon nitride layer.

According to the present invention, there is further provided a method of forming an interlayer insulating film between a first gate electrode and a second gate electrode in a nonvolatile memory device comprising the steps of;
forming a first layer of silicon nitride film on the first gate electrode; and
forming a first layer of silicon oxide film on the first layer of silicon oxide film.

If the thickness of the first silicon nitride film is set to be 60Å or less, electrons in the first silicon nitride film are prevented from diffusing into the first gate electrode after a data-erase operation. If the thickness of the first silicon nitride film is set over 60Å, electrons in the first silicon nitride film will diffuse into the first gate electrode after a data-erase operation, with the result that the threshold voltage of the semiconductor device is increased. Thus, it is preferable for stabilization of the threshold voltage of the semiconductor device to set the thickness of the first silicon nitride film to be 60Å or less.

If the thickness of the first silicon oxide film is set to be 50Å or more, the first silicon oxide film can have a sufficient energy gap, and tunneling of carriers through the first silicon oxide film can be prevented.

With the above two-layer insulating film structure, the breakdown voltage of the semiconductor device can be increased, though somewhat lower than that in the semiconductor device of the four-layer insulating film structure. Since, furthermore, the first silicon oxide film can be formed by oxidizing the first silicon nitride film, the quality of the first silicon oxide film can be enhanced, and accordingly the charge retaining properties of the semiconductor device can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed descriptions of the preferred embodiments given below, serve to explain the principles of the invention.

FIG. 1 is a cross-sectional view showing a nonvolatile semiconductor memory device according to an embodiment of the present invention;

FIGS. 2A to 2I are cross-sectional views of a semiconductor structure, for explaining a process of manufacturing the semiconductor memory device shown in FIG. 1;

FIG. 4 is a cross-sectional view showing a nonvolatile semiconductor memory device according to another embodiment of the present invention FIGS. 5A to 5I are cross-sectional views of a semiconductor structure, for explaining a process of manufacturing the semiconductor memory device shown in FIG. 4; and FIG. 6 shows the amounts of retained carriers in the case where the semiconductor memory devices of the present invention as shown in FIGS. 1 and 4 and a conventional semiconductor memory device are left at a high temperature of 300° C.

DETAILED DESCRIPTION OF THE PREFERRED EMBODIMENTS

Figure 2I:
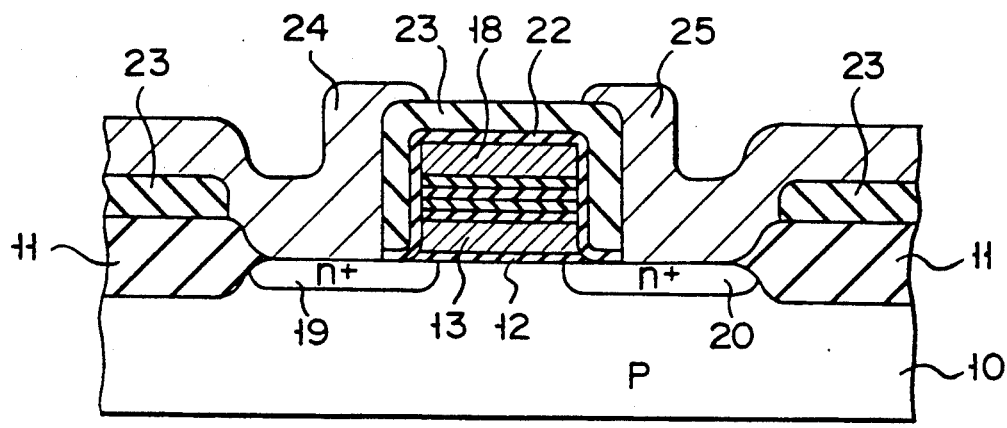

An embodiment of the present invention will now be described with reference to FIGS. 1, 2A–2I, and 3.

FIG. 1 is a cross-sectional view of an ultraviolet erasure type EPROM cell, to which the present invention has been applied.

A field oxide film 11 for defining a device region is formed in a surface area of a p-type silicon substrate 10. A thermal oxide film 12 is formed in the device region defined by the field oxide film 11. A floating gate electrode 13 of polycrystalline silicon is formed on the thermal oxide film 12. An interlayer insulating film of an NONO structure, wherein a silicon nitride film 14, a silicon oxide film 15, a silicon nitride film 16 and a silicon oxide film 17 are laminated in this order, is formed on the floating gate electrode 13. A control gate electrode 18 is formed on the silicon oxide film 17.

Since the silicon oxide film 15 is formed by oxidizing the silicon nitride film 14, the quality of the silicon oxide film 15 is excellent and the charge (carrier) retaining property thereof is enhanced.

It is desirable that the silicon nitride film 14 L have a small thickness, namely, 60Å or less, so that the threshold voltage of the semiconductor device is stabilized. Also, it is desirable that the silicon oxide film 15 have a thickness of 50Å or more, in order for the silicon oxide film 15 to have a sufficient energy gap and in order to prevent tunneling of carriers through the silicon oxide film 15. It is desirable that the silicon nitride film 16 have a thickness of 70Å or more in order to suppress leakage of electrons from the floating gate electrode 13 and have a thickness of 150Å or less in order to prevent holes from entering from the control gate electrode 18 into the silicon nitride film 16. Also, it is desirable that the silicon oxide film 17 have a thickness of 20Å or more in order to prevent holes from entering from the control gate electrode 18 into the silicon oxide film 17.

A source region 19 and a drain region 20 are formed in the device region of the substrate 10. A thin thermal oxide film 22 is formed to cover the floating gate electrode 13 and the control gate electrode 18. A CVD (chemical vapor deposition) oxide film 23 of a predetermined pattern for defining a source contact hole and a drain contact hole is formed as a passivation film on the semiconductor structure. A source electrode 24 is formed on the source region 19 and a drain electrode 25 is formed on the drain region 20, respectively, through the source contact hole and the drain contact hole formed in the CVD oxide film 23.

FIGS. 2A to 2I are cross-sectional views for illustrating a process for manufacturing the ultraviolet erasure type EPROM cell shown in FIG. 1. In these figures, the same elements in FIG. 1 are denoted by the same reference numerals.

First, as shown in FIG. 2A, a field oxide film 11 for defining a device region is formed in a surface portion of a p-type silicon substrate 10 by a selective oxidation method. The resultant body is subjected to a thermal treatment at about 900° C., whereby a thermal oxide film 112 with a thickness of about 200Å, a portion of which becomes a first gate insulating film 12, is formed on the device region of the substrate 10.

Then, as shown in FIG. 2B, a first polycrystalline silicon film 113 with a thickness of about 4000Å, a portion of which becomes a floating gate electrode 13, is formed on the semiconductor structure by means of a CVD (chemical vapor deposition) process. Phosphorus is then diffused in the first polycrystalline silicon film 113 at about 900° C., with POCl$_3$ being used as a diffusion source. In the step shown in FIG. 2C, a first silicon nitride film 114 with a thickness of about 110Å is formed on the first polycrystalline silicon film 113, for example, by means of an LP (low pressure) CVD method. The silicon nitride film 114 is oxidized by a burning oxidation method, and a first silicon oxide film 115 with a thickness of about 90Å is formed on the silicon nitride film 114. At this time, the silicon nitride film 114 is consumed by about 60Å, and the thickness thereof becomes about 50Å. Then, a second silicon nitride film 116 with a thickness of about 120Å is formed on the silicon oxide film 115, for example, by means of the LPCVD method. The second silicon nitride film 116 is oxidized by a burning oxidation method, and a second silicon oxide film 117 with a thickness of about 30Å is formed on the silicon nitride film 116.

At this time, the silicon nitride film 116 is consumed by about 20Å, and the thickness thereof becomes about 100Å. As a result, an interlayer insulating film of a four-layer structure, wherein the silicon nitride film 114, silicon oxide film 115, silicon nitride film 116 and silicon oxide film 117 are laminated in this order, is formed on the polycrystalline silicon film 113. In FIG. 2D, a second polycrystalline silicon film 118 with a thickness of about 4000Å, a portion of which becomes a control gate electrode 18, is formed on the silicon oxide film 117 by means of the CVD method. Phosphorus is diffused in the second polycrystalline silicon film 118 for 30 minutes at about 900° C., with POCl$_3$ being used as a diffusion source. Then, as shown in FIG. 2E, the second polycrystalline silicon film 118, silicon oxide film 117, silicon nitride film 116, silicon oxide film 115, silicon nitride film 114, first polycrystalline silicon film 113, and thermal oxide film 112 are selectively etched in this order by means of a photoetching method. As a result, the floating gate electrode 13, which is a part of the first polycrystalline silicon film 113, is formed on the substrate 10, with the first gate insulating film 12, which is a part of the thermal oxide film 112, being interposed between the floating gate electrode 13 and the substrate 10. A second gate insulating film 26, comprising interlayer insulating layers 14 (silicon nitride film), 15 (silicon oxide film), 16 (silicon nitride film), and 17 (silicon oxide film), which are parts of the four-layer structure insulating layer (114–117), is formed on the floating gate electrode 13. The control gate electrode 18, which is a part of the second polycrystalline silicon film 118, is formed on the second gate insulating film 26. Subsequently, arsenic is ion-implanted in the substrate 10 with the control gate electrode 18 used as a mask, thus forming n+type source and drain regions 19 and 20 in a surface portion of the substrate 10, as shown in FIG. 2F. The semiconductor structure is subjected to thermal oxidation at about 950° C. in a dry oxidation atmosphere, to form a thermal oxide film with a thickness of 400Å. This thermal oxide film is selectively etched in a predetermined pattern, thus forming a thermal oxide film 22 with a thickness of 400521 on the surfaces of the floating gate electrode 13 and the control gate electrode 18, as shown in FIG. 2G. Then, a CVD oxide film 23 with a thickness of about 0.8 μm, which is doped with phosphorus, is formed as a passivation film on the resultant semiconductor structure. Contact holes are formed in the CVD oxide film 23 by means of a photoetching method, as shown in FIG. 2H. An alloy film formed of aluminum and silicon, with a thickness of 1.0 μm, is formed on the semiconductor structure by means of the CVD method. The alloy film is patterned, and a source electrode 24 is formed on the source region 19 and a drain electrode 25 is formed on the drain region 20, as shown in FIG. 2I.

Through the above process, the EPROM shown in FIG. 1 is formed. According to the above method, there is provided an NONO structure of the silicon nitride film 14, silicon oxide film 15, silicon nitride film 16 and silicon oxide film 17. Since the first silicon oxide film 15 close to the floating gate electrode 13 is obtained by oxidizing the first silicon nitride film 14, the film 15 has a high quality. Thus, electrons charged in the floating gate can be effectively prevented from flowing out to the control gate 18. Thus, the EPROM cell with high charge remaining properties can be provided.

In the above description of the manufacturing process, the first silicon nitride film 114 a part of which forms the first silicon nitride film 14 is described as being formed on the first polycrystalline film 113 a part of which forms the floating gate electrode 13. However, in fact, a native oxide film (not shown) is inevitably formed on the polycrystalline film 113 by native oxidation before the formation of the silicon nitride film 114. Hence, strictly speaking, the silicon nitride film 114 is formed on the native oxide film. However, the native oxide film is generally extremely thin so that the native oxide film substantially does not affect the operation of the semiconductor device. Thus, the presence of the native oxide film is negligible to the operation of the semiconductor device. In view of the above reason, the silicon nitride film 114 has been described as being formed on the polycrystalline silicon film 113.

Figure 3:
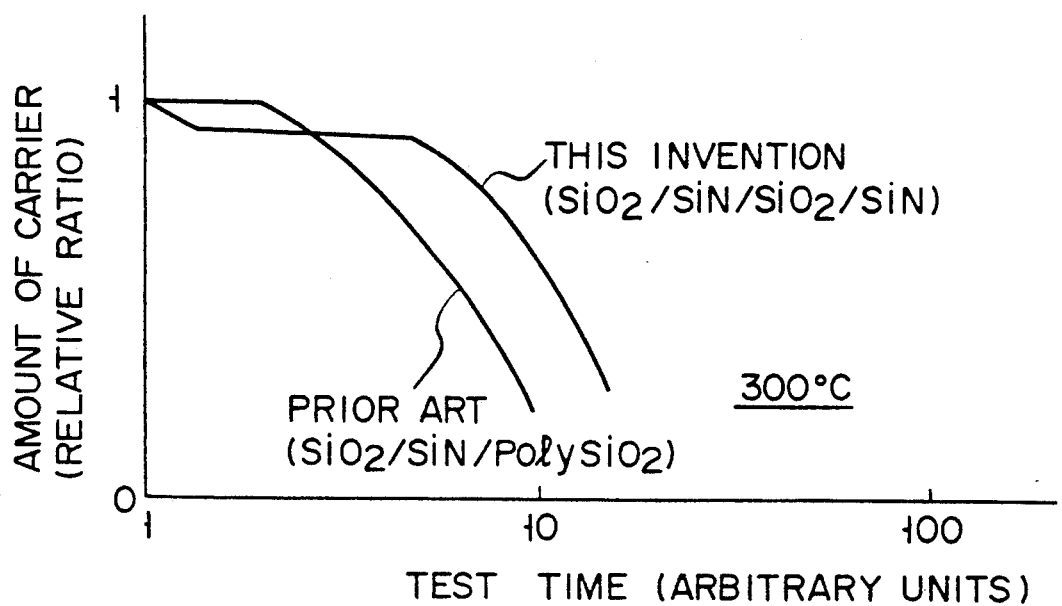
FIG. 3 shows the amounts of retained carriers in the case where the semiconductor memory device of the present invention as shown in FIG. 1 and a conventional semiconductor memory device are left at a high temperature of 300° C.

FIG. 3 shows the amounts of retained carriers in the case where the EPROM cell of the present invention as shown in FIG. 1 and a conventional EPROM cell are left at a high temperature of 300° C. As is obvious from FIG. 3, the amount of retained carriers in the EPROM of the present invention is remarkably greater than that in the conventional EPROM cell, through, in the initial several hours, the conventional EPROM cell has a greater amount of retained carriers than the EPROM cell of the present invention.

The above-described embodiment was directed to EPROM. However, needless to say, the present invention is effectively applicable to other nonvolatile memory devices.

Another embodiment of the present invention will now be described with reference to FIGS. 4, 5A–5I, and 6.

FIG. 4 is a cross-sectional view of another ultraviolet erasure type EPROM cell, to which the present invention has been applied. Same reference numerals are allotted to the parts or portions corresponding to those in the former embodiment.

A field oxide film 11 for defining a device region is formed in a surface area of a p-type silicon substrate 10. A thermal oxide film 12 is formed in the device region defined by the field oxide film 11. A floating gate electrode 13 of polycrystalline silicon is formed on the thermal oxide film 12. An interlayer insulating film of an NO structure, wherein a silicon nitride film 14 and a silicon oxide film 15 are laminated in this order, is formed on the floating gate electrode 13. A control gate electrode 18 is formed on the silicon oxide film 15.

Since the silicon oxide film 15 is formed by oxidizing the silicon nitride film 14, the quality of the silicon oxide film 15 is excellent and the charge (carrier) retaining property thereof is enhanced.

It is desirable that the silicon nitride film 14 have a small thickness, namely, 60Å or less, so that the threshold voltage of the semiconductor device is stabilized. Also, it is desirable that the silicon oxide film 15 have a thickness of 50Å or more, in order for the silicon oxide film 15 to have a sufficient energy gap and in order to prevent tunneling of carriers through the silicon oxide film 15.

A source region 19 and a drain region 20 are formed in the device region of the substrate 10. A thin thermal oxide film 22 is formed to cove the floating gate electrode 13 and the control gate electrode 18. A CVD (chemical vapor deposition) oxide film 23 of a predetermined pattern for defining a source contact hole and a drain contact hole is formed as a passivation film on the semiconductor structure. A source electrode 24 is formed on the source region 19 and a drain electrode 25 is formed on the drain region 20, respectively, through the source contact hole and the drain contact hole formed in the CVD oxide film 23.

FIGS. 5A to 5I are cross-sectional views for illustrating a process for manufacturing the ultraviolet erasure type EPROM cell shown in FIG. 4. In these figures, the same elements in FIG. 4 are denoted by the same reference numerals.

Figure 5C:
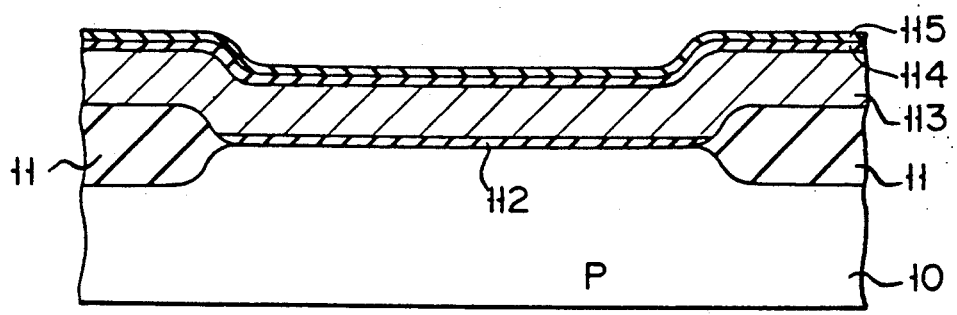
Figure 5D:
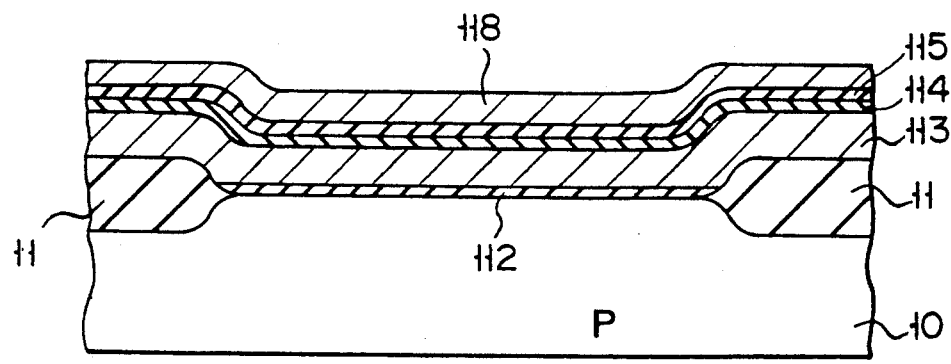
Figure 5E:
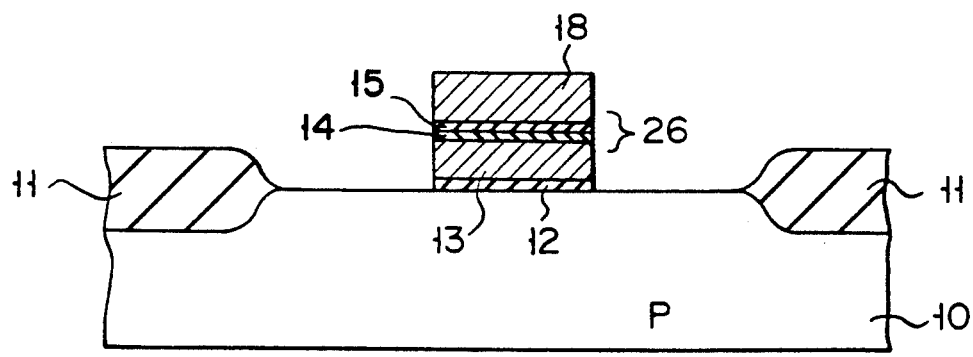
Figure 5F:
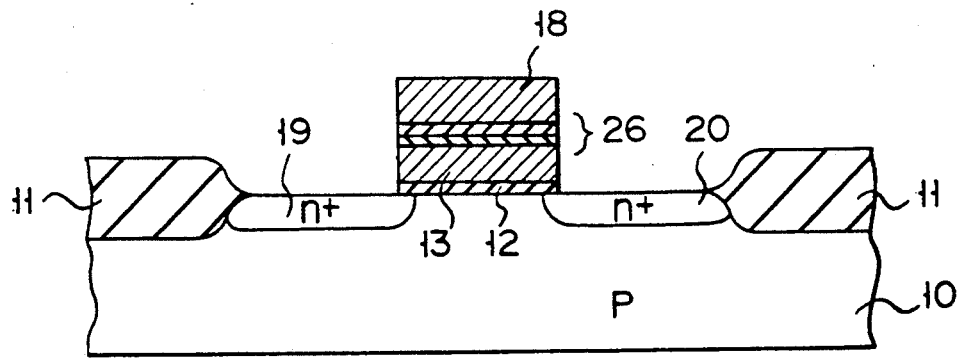
Figure 5G:
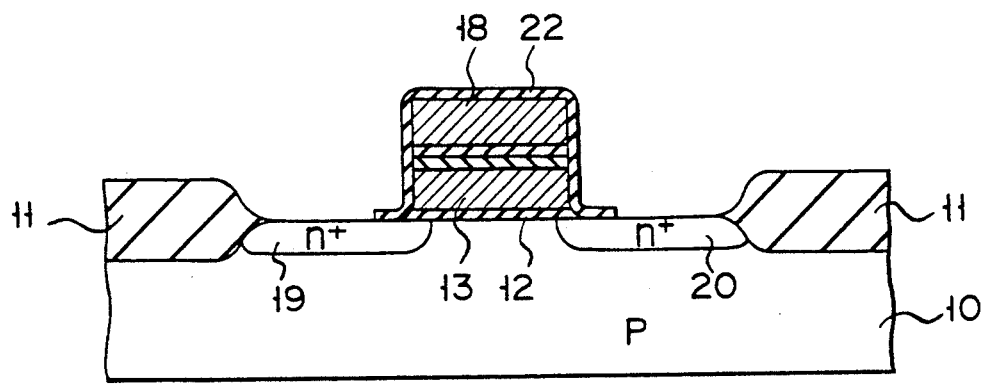
Figure 5H:
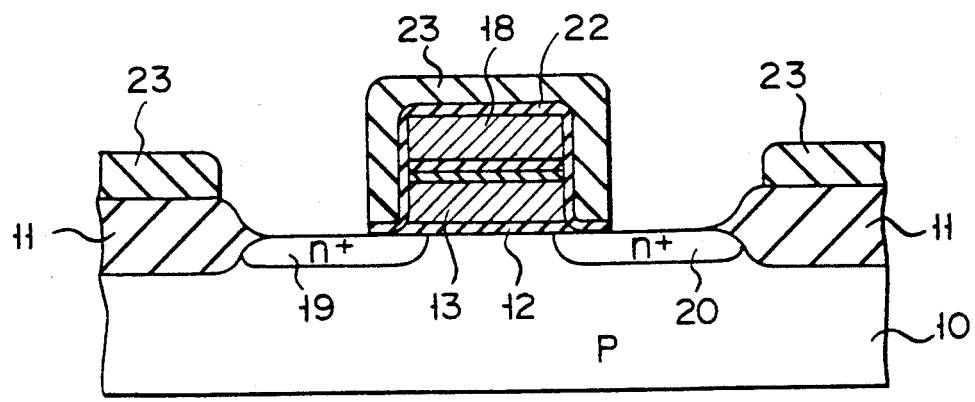

First, as shown in FIG. 5A, a field oxide film 11 for defining a device region is formed in a surface portion of a p-type silicon substrate 10 by a selective oxidation method. The resultant body is subjected to a thermal treatment at about 900° C., whereby a thermal oxide film 112 with a thickness of about 200Å, a portion of which becomes a first gate insulating film 12, is formed on the device region of the substrate 10. Then, as shown in FIG. 5B, a first polycrystalline silicon film 113 with a thickness of about 4000Å, a portion of which becomes a floating gate electrode 13, is formed on the semiconductor structure by means of a CVD (chemical vapor deposition) process. Phosphorus is then diffused in the first polycrystalline silicon film 113 at about 900° C., with POCl₃ being used as a diffusion source. In the step shown in FIG. 5C, a first silicon nitride film 114 with a thickness of about 110Å is formed on the first polycrystalline silicon film 113, for example, by means of an LP (low pressure) CVD method. The silicon nitride film 114 is oxidized by a burning oxidation method, and a first silicon oxide film 115 with a thickness of about 90Å is formed on the silicon nitride film 114. At this time, the silicon nitride film 114 is consumed by about 60Å, and the thickness thereof becomes about 50Å. As a result, an interlayer insulating film of a two-layer structure, wherein the silicon nitride film 114 and silicon oxide film 115 are laminated in this order, is formed on the polycrystalline silicon film 113. In FIG. 5D, a second polycrystalline silicon film 118 with a thickness of about 4000Å, a portion of which becomes a control gate electrode 18, is formed on the silicon oxide film 115 by means of the CVD method. Phosphorus is diffused in the second polycrystalline silicon film 118 for 30 minutes at about 900° C., with POCl₃ being used as a diffusion source. Then, as shown in FIG. 5E, the second polycrystalline silicon film 118, silicon oxide film 115, silicon nitride film 114, first polycrystalline silicon film 113, and thermal oxide film 112 are selectively etched in this order by means of a photoetching method. As a result, the floating gate electrode 13, which is a part of the first polycrystalline silicon film 113, is formed on the substrate 10, with the first gate insulating film 12, which is a part of the thermal oxide film 112, being interposed between the floating gate electrode 13 and the substrate 10. A second gate insulating film 26, comprising interlayer insulating layers 14 (silicon nitride film) and 15 (silicon oxide film), which are parts of the two-layer structure insulating layer (114 and 115), is formed on the floating gate electrode 13. The control gate electrode 18, which is a part of the second polycrystalline silicon film 118, is formed on the second gate insulating film 26. Subsequently, arsenic is ion-implanted in the substrate 10 with the control gate electrode 18 used as a mask, thus forming n+type source and drain regions 19 and 20 in a surface portion of the substrate 10, as shown in FIG. 5F. The semiconductor structure is subjected to thermal oxidation at about 950° C. in a dry oxidation atmosphere, to form a thermal oxide film with a thickness of 400Å. This thermal oxide film is selectively etched in a predetermined pattern, thus forming a thermal oxide film 22 with a thickness of 400Å on the surfaces of the floating gate electrode 13 and the control gate electrode 18, as shown in FIG. 5G. Then, a CVD oxide film 23 with a thickness of about 0.8 μm, which is doped with phosphorus, is formed as a passivation film on the resultant semiconductor structure. Contact holes are formed in the CVD oxide film 23 by means of a photoetching method, as shown in FIG. 5H. An alloy film formed of aluminum and silicon, with a thickness of 1.0 μm, is formed on the semiconductor structure by means of the CVD method. The alloy film is patterned, and a source electrode 24 is formed on the source region 19 and a drain electrode 25 is formed on the drain region 20, as shown in FIG. 5I.

Through the above process, the EPROM shown in FIG. 4 is formed. According to the above method, there is provided an NO structure of the silicon nitride film 14 and silicon oxide film 15. Since the first silicon oxide film 15 close to the floating gate electrode 13 is obtained by oxidizing the first silicon nitride film 14, the film 15 has a high quality. Thus, electrons charged in the floating gate can be effectively prevented from flowing out to the control gate 18. Thus, the EPROM cell with high charge remaining properties can be provided.

In the above description of the manufacturing process, the first silicon nitride film 114 a part of which forms the first silicon nitride film 14 is described as being formed on the first polycrystalline film 113 a part of which forms the floating gate electrode 13. However, in fact, a native oxide film (not shown) is inevitably formed on the polycrystalline film 113 by native oxidation before the formation of the silicon nitride film 114. Hence, strictly speaking, the silicon nitride film 114 is formed on the native oxide film. However, the native oxide film is generally extremely thin so that the native oxide film substantially does not affect the operation of the semiconductor device. Thus, the presence of the native oxide film is negligible to the operation of the semiconductor device. In view of the above reason, the silicon nitride film 114 has been described as being formed on the polycrystalline silicon film 113.

FIG. 6 shows the amounts of remained carriers in the case where the EPROM cells of the present invention as shown in FIGS. 1 and 4 and a conventional EPROM cell are left at a high temperature of 300° C. As is obvious from FIG. 6, the amounts of retained carriers in the EPROMs of the present invention are remarkably greater than that in the conventional EPROM cell, through, in the initial several hours the conventional EPROM cell has a greater amount of retained carriers than the EPROM cells of the present invention.

The above-described embodiment was directed to EPROM. However, needless to say, the present invention is effectively applicable to other nonvolatile memory devices.

Additional advantages and modifications will readily occur to those skilled in the art. Therefore, the invention in its broader aspects is not limited to the specific details and the representative devices shown and described. Accordingly, departures may be made from such details without departing from the spirits or scope of the general inventive concept as defined by the appended claims and their equivalents.

What is claimed is:

1. A nonvolatile semiconductor memory device with a first gate structure and a second gate structure, the first gate structure being an electrically insulated floating gate into which charges are injected, comprising:
   a first gate electrode;
   a second gate electrode; and
   an interlayer insulating film provided between the first and second gate electrodes, the interlayer insulating film having a four-layer structure wherein a first silicon nitride film, a first silicon oxide film, a second silicon nitride film and a second silicon oxide film are formed in that order on the first gate electrode.

2. The nonvolatile memory device according to claim 1, wherein the thickness of the first nitride film is less than about 60 Angstroms.

3. The nonvolatile memory device according to claim 1, wherein the thickness of the first oxide film is more than 50 Angstroms.

4. The nonvolatile memory device according to claim 1, wherein the thickness of the second nitride film is between about 70 Angstroms and about 150 Angstroms.

5. The nonvolatile memory device according to claim 1, wherein the thickness of the second oxide film is more than 20 Angstroms.

6. A four-layer insulating gate structure for use in a nonvolatile semiconductor cell having a first gate structure and a second gate structure, the first gate structure being an electrically insulated floating gate into which charges are injected, comprising:
   a first silicon nitride film formed on the first gate structure;
   a first silicon oxide film formed on the first silicon nitride film;
   a second silicon nitride film formed on the first silicon oxide film;
   a second silicon oxide film formed on the second silicon nitride film; and
   the second gate structure formed on the second silicon oxide film.

7. The insulating gate structure according to claim 6, wherein the thickness of the first silicon nitride film is less than about 60 Angstroms.

8. The insulating gate structure according to claim 6, wherein the thickness of the first silicon oxide film is more than 50 Angstroms.

9. The insulating gate structure according to claim 6, wherein the thickness of the second silicon nitride film is between about 70 Angstroms and about 150 Angstroms.

10. The insulating gate structure according to claim 6, wherein the thickness of the second silicon oxide film is more than 20 Angstroms.

11. A nonvolatile semiconductor memory device including a plurality of memory cells, each memory cell having a first gate structure and a second gate structure, the first gate structure being an electrically insulated floating gate into which charges are injected, comprising:
   a first gate electrode;
   a second gate electrode; and
   an insulating multi-layer structure between the first gate electrode and the second gate electrode, the insulating film structure including:
   a first silicon nitride layer formed on the first gate electrode;
   a first silicon oxide layer formed on the first silicon nitride layer;
   a second silicon nitride layer formed on the first silicon oxide layer; and
   a second silicon oxide layer formed on the second silicon nitride layer.

12. The nonvolatile semiconductor memory device according to claim 11, wherein the thickness of the first silicon nitride layer is less than about 60 Angstroms.

13. The nonvolatile semiconductor memory device according to claim 11, wherein the thickness of the first silicon oxide layer is more than 50 Angstroms.

14. The nonvolatile semiconductor memory device according to claim 11, wherein the thickness of the second silicon nitride layer is between about 70 Angstroms and about 150 Angstroms.

15. The nonvolatile semiconductor memory device according to claim 11, wherein the thickness of the second silicon oxide layer is more than 20 Angstroms.

16. A nonvolatile semiconductor memory cell having a first gate structure and a second gate structure, the first gate structure being an electrically insulated floating gate into which charges are injected, comprising:
   a first gate electrode;
   a second gate electrode; and
   an insulating multi-layer structure between the first gate electrode and the second gate electrode, the insulating film structure including:
   a first silicon nitride layer formed on the first gate electrode;
   a first silicon oxide layer formed on the first silicon nitride layer;
   a second silicon nitride layer formed on the first silicon oxide layer; and
   a second silicon oxide layer formed on the second silicon nitride layer.

17. The nonvolatile semiconductor memory cell according to claim 16, wherein the thickness of the first silicon nitride layer is less than about 60 Angstroms.

18. The nonvolatile semiconductor memory cell according to claim 16, wherein the thickness of the first silicon oxide layer is more than 50 Angstroms.

19. The nonvolatile semiconductor memory cell according to claim 16, wherein the thickness of the second silicon nitride layer is between about 70 Angstroms and about 150 Angstroms.

20. The nonvolatile semiconductor memory cell according to claim 16, wherein the thickness of the second silicon oxide layer is more than 20 Angstroms.

21. A method of forming an interlayer insulating film between a first gate electrode and a second gate electrode in a nonvolatile memory device, the first gate electrode being an electrically insulated floating gate into which charges are injected, comprising the steps of:
   forming a first layer of silicon nitride film on the first gate electrode;
   forming a first layer of silicon oxide film on the first layer of silicon nitride film;
   forming a second layer of silicon nitride film on the first layer of silicon oxide film;
   forming a second layer of silicon oxide film on the second layer of silicon nitride film; and
   forming the second gate structure on the second layer of silicon oxide film.

22. The method according to claim 21, wherein the first layer of silicon nitride is formed having a thickness of less than about 60 Angstroms.

23. The method according to claim 21, wherein the first layer of silicon oxide is formed having a thickness of more than 50 Angstroms.

24. The method according to claim 21, wherein the second layer of silicon nitride is formed having a thickness of between about 70 Angstroms and about 150 Angstroms.

25. The method according to claim 21, wherein the second layer of silicon oxide is formed having a thickness of more than 20 Angstroms.

* * * * *